United States Patent
Joshi et al.

[11] Patent Number: 6,100,199
[45] Date of Patent: Aug. 8, 2000

[54] EMBEDDED THERMAL CONDUCTORS FOR SEMICONDUCTOR CHIPS

[75] Inventors: Rajiv Vasant Joshi, Yorktown Heights; William Robert Reohr, Bronx, both of N.Y.

[73] Assignee: International Business Machines Corporation, Armonk, N.Y.

[21] Appl. No.: 09/296,846

[22] Filed: Apr. 22, 1999

Related U.S. Application Data

[62] Division of application No. 09/006,575, Jan. 13, 1998, Pat. No. 5,955,781.

[51] Int. Cl.[7] .................................................. H01L 21/00
[52] U.S. Cl. .......................... 438/694; 438/700; 438/758
[58] Field of Search ................................. 438/690, 694, 438/700, 703, 758, 704, 705; 257/77, 712, 713, 714, 717, 719

[56] References Cited

U.S. PATENT DOCUMENTS

| | | | |
|---|---|---|---|
| 4,935,864 | 6/1990 | Schmidt et al. | 257/714 |
| 5,371,407 | 12/1994 | Goldman | 257/675 |
| 5,391,914 | 2/1995 | Sullivan et al. | 257/635 |
| 5,455,448 | 10/1995 | Benjamin | 257/565 |
| 5,621,616 | 4/1997 | Owens et al. | 257/713 |

OTHER PUBLICATIONS

Edholm et al., "Silicon–on–Diamond MOS–Transistors with Thermally Grown Gate Oxide", IEEE, International Conference, Oct. 1997, pp. 30–31.

*Primary Examiner*—Benjamin L. Utech
*Assistant Examiner*—Kin-Chan Chen

[57] ABSTRACT

A semiconductor chip structure includes a substrate, at least one thermal conductor embedded within the semiconductor chip structure, the thermal conductor providing electrical insulation and a plurality of devices formed within the structure adjacent to the at least one thermal conductor such that during operation heat produced in the devices is transferred into and through the at least one thermal conductor to reduce an operating temperature of the devices. This structure is particularly useful in silicon-on insulator devices. A method of forming embedded thermal conductors in a semiconductor chip includes the steps of providing a substrate having an oxide layer formed thereon, etching trenches into the oxide layer, depositing diamond to fill the trenches to form thermal conductors contacting the substrate and forming devices and contacts adjacent to the thermal conductors for providing heat flow paths to reduce an operating temperature of the devices.

17 Claims, 7 Drawing Sheets

EMBEDDED THERMAL CONDUCTORS FOR SEMICONDUCTOR CHIPS

This is a divisional of application Ser. No. 09/006,575, filed Jan. 13, 1998 now U.S. Pat. No. 5,955,781.

BACKGROUND OF THE INVENTION

1. Field of the Invention

This invention relates to reducing heat energy in semiconductors and, more particularly, to thermal conductors embedded within the semiconductor for removing heat therefrom.

2. Description of the Related Art

Modern VLSI chips require cooling to improve reliability of their circuits and interconnects, to increase their circuit switching performance, and to regulate thermally generated noise in their circuits. Cooling reduces the likelihood that a metal wire will form voids or a contact will become open. It also reduces the extent of time-dependent transistor mobility and threshold degradation which adversely affects circuit performance and operation. Furthermore, in typical CMOS microprocessors, every reduction in temperature of 10 degrees Celsius produces a 2% rise in operating frequency. For CMOS transistors, high temperatures yield significantly larger leakage currents, due to the thermal generation of carriers. This deleterious current doubles every 11 degrees Celsius and is known to adversely affect the functional operation of dynamic and analog circuits.

As field effect transistor (FET) channel length decreases, the leakage current grows exponentially. Leakage current will become a dominant source of circuit noise unless circuit operating temperatures can be decreased through cooling. Ideally, chips should be cooled close to absolute zero.

In reality, cooling systems are constrained by economic and technical considerations. Present cooling systems vary widely in complexity and cost. Personal computers use small fans to remove hot air from circuit boards whereas high cost mainframes use plumbing to circulate liquid coolant to every chip. Engineering capital has been expended to remove heat from a collection of chips attached to a circuit board or thermal conduction module.

Cooling may be applied selectively to individual chips within a board. One such example is described in U.S. Pat. No. 4,935,864 to W. L. Schmidt et al. (Schmidt). Schmidt describes a means to preferentially cool individual chips on a circuit board with a thermoelectric chiller. As circuit integration density grows exponentially, individual hot spots within a chip will require an on-chip means to dissipate heat.

Motivation for integrating heat reduction into a semiconductor chip becomes obvious from a thermal map of the current generation of high speed memory chips. Referring to FIG. 1, cross hatched regions 12 on a memory chip 10 approximate regions where hot spots may occur. High temperature areas correspond to the physical locations of a bit decode, a word decode, and sense amplifier circuitry which switch often while performing memory chip functions. Little heat is generated in memory cell quadrants 14 because memory cells are composed of small transistors and are used infrequently. Temperature differences occur wherever circuit diversity exists, and such diversity exists in every VLSI chip from memory to microprocessors.

It would be advantageous for integrated circuit technology with ever increasing power density to distribute heat more evenly throughout a chip. In U.S. Pat. No. 5,621,616 to A. H. Owens (Owens), a heat dissipation technique is provided. Owens describes a high-conductivity heat transfer pathway which draws heat away from the semiconductor substrate, through the various metal levels and vias, through a solder bump. The heat is drawn into the chip carrier where heat may be removed by convection to the ambient air. Owen proposes to embed metal plugs deep into the chip substrate to collect the heat generated by the transistors and then to remove that heat through metal interconnect already existing in VLSI chips.

Very Large Scale Integrated (VLSI) circuits shrink to improve performance and thereby increase operating frequency. Heat is generated due to constant switching of these devices. The removal of this heat becomes a major obstacle to the efficient performance of theses devices. Therefore, a need exists for a heat conductor for semiconductors. The material of the heat conductor should provide high thermal conductivity and low electrically conductivity. It is therefore advantageous to integrate diamond thermal conductors within a semiconductor chip to distribute heat more evenly throughout the chip, conduct heat away from hot areas in a chip, and conduct heat to the chip's exterior.

SUMMARY OF THE INVENTION

A semiconductor chip structure includes a substrate, at least one thermal conductor embedded within the semiconductor chip structure, the thermal conductor providing electrical insulation and a plurality of devices formed within the structure adjacent to the at least one thermal conductor such that during operation heat produced in the devices is transferred into and through the at least one thermal conductor to reduce an operating temperature of the devices.

In other embodiments, the thermal conductors may be made from diamond. The thermal conductors may be covered with a nitride layer to prevent oxidation. A backside surface and a plurality of thermal conductors transversely embedded into the substrate through the backside surface for increasing heat flow therethrough may also be included. The backside surface may be etched back to expose a larger area of the thermal conductors to increase heat flow through the backside surface. A thermal grease disposed on the backside surface and a cooling tower abutting the thermal grease for increasing heat flow from the substrate may also be included. Contacts may connect to metal interconnects wherein the thermal conductors contact the contacts to provide a heat flow path through the contacts and into the metal interconnects. A metal having high thermal conductivity may be used in the interconnects and contacts. The metal may include copper or aluminum.

In other embodiments, the at least one thermal conductor is formed laterally adjacent to the devices. The at least one thermal conductor may be formed on the substrate. An oxide layer may be formed on the substrate, the oxide layer having openings formed therethrough and each thermal conductor may be formed within the openings in the oxide layer such that each thermal conductor is adjacent to the devices and in contact with the substrate. The at least one thermal conductor also may contact at least one contact.

A SOI (silicon-on-insulator) semiconductor chip structure includes a substrate, an oxide layer formed on the substrate, at least one thermal conductor embedded within the SOI semiconductor chip structure. The thermal conductor provides electrical insulation. Also, a plurality of devices formed within the structure adjacent to the at least one thermal conductor are included such that during operation heat produced in the devices is transferred into and through the at least one thermal conductor to reduce an operating temperature of the devices.

In other embodiments, the at least one thermal conductor of the SOI structure may be made from diamond. At least one thermal conductor may be covered with a nitride layer to prevent oxidation. The SOI semiconductor chip structure may further include contacts for connecting to metal interconnects wherein the at least one thermal conductor contacts the contacts to provide a heat flow path through the contacts and into the metal interconnects. The metal interconnects may include a metal having high thermal conductivity, such as copper or aluminum. The each thermal conductor may be formed laterally adjacent to the devices.

A method of forming embedded thermal conductors in a semiconductor chip includes the steps of providing a substrate having an oxide layer formed thereon, etching trenches into the oxide layer, depositing diamond to fill the trenches to form thermal conductors contacting the substrate and forming devices and contacts adjacent to the thermal conductors for providing heat flow paths to reduce an operating temperature of the devices.

In other methods, the step of depositing diamond to fill the trenches to form thermal conductors may further include the step of mixing methane gas and hydrogen gas in a hot filament system to produce polycrystalline diamond. The step of forming devices and contacts adjacent to the thermal conductors for providing heat flow paths may include depositing a nitride layer on the thermal conductors to provide protection from diamond oxidation and forming openings in the nitride layer to connect contacts to the thermal conductors. The step of forming interconnects for connecting to the contacts such that the interconnects provide a heat flow path from the thermal conductors may be included.

A method of forming embedded thermal conductors in a SOI semiconductor chip includes the steps of providing a SOI substrate having an oxide layer formed thereon, etching trenches to the oxide layer, depositing diamond to fill the trenches to form thermal conductors contacting the oxide layer and forming devices and contacts adjacent to the thermal conductors for providing heat flow paths to reduce an operating temperature of the devices.

In other methods, the step of depositing diamond to fill the trenches to form thermal conductors may further include the step of mixing methane gas and hydrogen gas in a hot filament system to produce polycrystalline diamond. The step of forming devices and contacts adjacent to the thermal conductors for providing heat flow paths may include the steps of depositing a nitride layer on the thermal conductors to provide protection from diamond oxidation and forming openings in the nitride layer to connect contacts to the thermal conductors. The step of forming interconnects for connecting to the contacts such that the interconnects provide a heat flow path from the thermal conductors may also be included.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
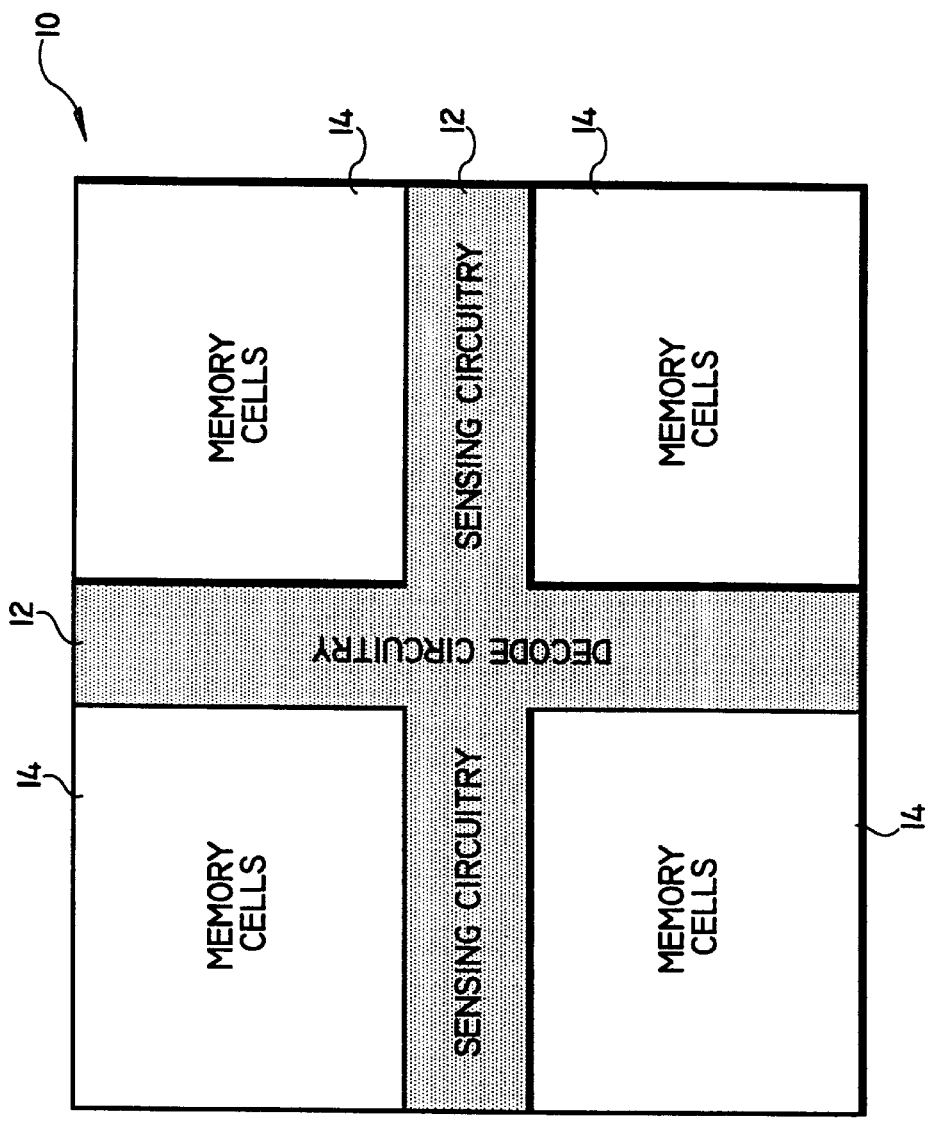
FIG. 1 is a thermal map of a typical prior art memory chip in which the cross hatched markings designate high temperature regions.

The present invention provides an integrated thermal conductor for dissipating heat generated in semiconductor devices. The heat conductor is formed on a silicon substrate so that heat drawn from the semiconductor device may be transferred into the substrate and then to the exterior of the semiconductor device. The thermal conductor conducts heat away from hot spots on the device to enhance its performance. Thermal conductors having high thermal conductivities and low electrical conductivities are preferred since these materials can provide electrical isolation of semiconductor devices while reducing detrimental thermal effects due to electronic activity.

Diamond, or diamond like substances, such as diamond like carbon, are suited to act as a thermal conductor within a VLSI chip. Diamond may be embedded into a chip, during various processing steps, to form thermal conducting elements. Diamond has a high thermal conductivity, more than 14 times that of silicon (depending on the quality of the diamond crystal), but is an electric insulator. Diamond also adheres well to silicon. These material characteristics make it an ideal candidate as a heat conducting element obviously because it neither disrupts the delicate electrical environment or damages the silicon crystal. The properties of chemical vapor deposited (CVD) Diamond are given in Table 1:

TABLE 1

| | MATERIAL | | | | |
| --- | --- | --- | --- | --- | --- |
| PROPERTIES | Diamond | Silicon | Silicon Dioxide | Tungsten | Copper |
| Thermal Conductivity (W/cm-K) | 18 to 20 | 1.4 | 0.014 | 1.7 | 4 |
| Dielectric Constant (CTE) | 5.7 | — | 3.9 | — | — |
| Thermal Expansion Coefficient ($\times 10^{-6}$ cm/degree C.) | 2.8 | 3.5 | 0.55 | 4.5 | 14.2 |

Research on characterization and growth behavior of polycrystalline CVD diamond on various substrates has been completed due to its favorable thermal, mechanical, and electrical properties. A major obstacle in using diamond, however, has been the difficulty of growing diamond on patterned silicon substrates. The following disclosure describes a method and apparatus for the integration of diamond into VLSI circuit processing technology thereby using diamond as a heat sink to remove heat. The following disclosure includes processing steps used to embed a diamond thermal conductor into a semiconductor chip.

A hot wall filament chemical vapor deposition (CVD) system may be used to process diamond to create films. Diamond films may be deposited using a gas mixture of $CH_4$ and $H_2$. The gas mixture may include about 10–30% volume $CH_4$ and about 70–90% volume $H_2$ although other gases may be included. Gas flows are measured and controlled by flow meters. The process effect was studied in terms of growth by varying deposition temperature, pressure and ratio of $CH_4$ and $H_2$ concentration. For physical deposition (PD) patterned Si substrates may be used. The patterned substrates may be formed by reactively ion etching (RIE) 1 to 2 microns of plasma enhanced tertaethylorthosilicate (TEOS) on top of Si substrates. Using patterned wafers (with and without pretreatment) and tailoring the deposition time, a diamond thickness may be achieved. The temperature may be varied from 600–1100° C. to achieve these results. The average growth rates are characterized by measuring the thickness by cross-sectional scanning electron analysis (SEM) technique. The surface morphology and fill characteristics are evaluated by SEM analysis. Raman spectral analysis may be carried out to verify the purity of the diamond films.

Figure 2A:
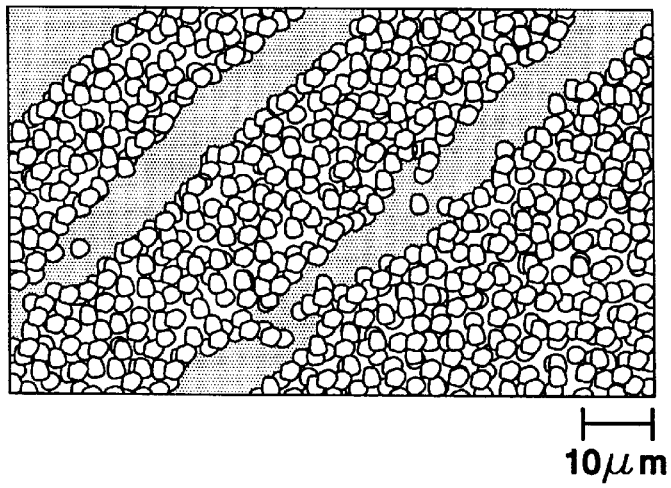
FIGS. 2A, 2B, and 2C are Scanning Electron Microscope (SEM) images of diamond growth at different magnifications.
Figure 2B:
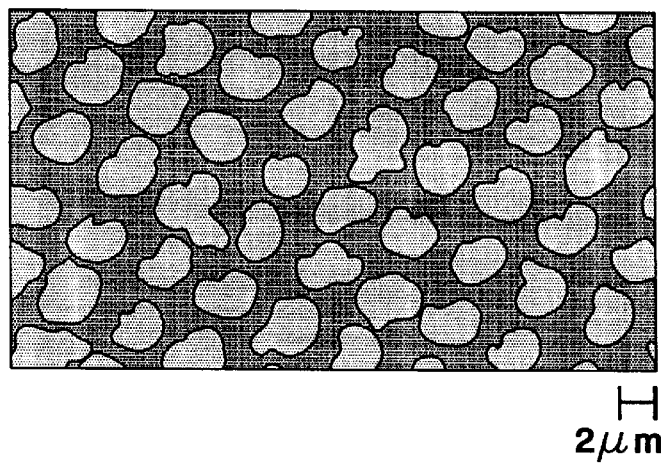
Figure 2C:
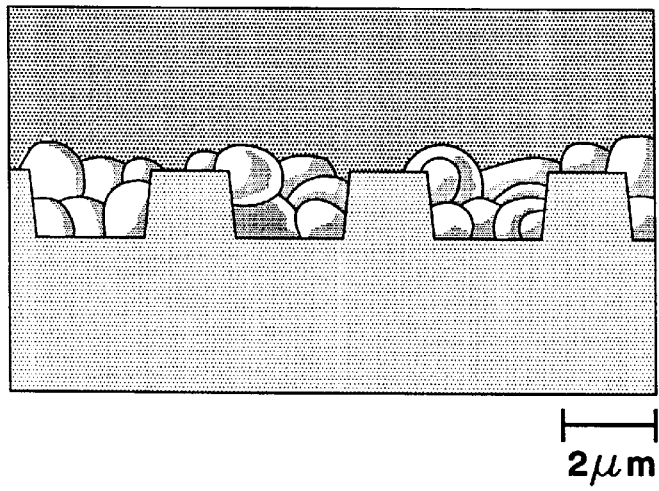

Referring now to FIGS. 2A–C, a SEM image of diamond growth at varying magnifications is shown. As can be seen from the SEM images, the growth of diamond depends on the defect area of the Si substrate. The features or depressions in Si or $SiO_2$ can contribute to defects and form good nucleation sites for the deposited diamond. Surfaces having defects act as nucleation sites making the deposition selective with respect to surfaces with non-defect areas. The filling starts at the bottom or at the corners of the trenches as these areas would form nuclei with low free energy of formation. The deposition rate achieved may be between 2–3 μm/hour. Higher growth rates are contemplated as well. Diamond may be formed at the bottom of a via or a trench. Also, due to the CVD process diamond may be deposited in an encroached area or in an undercut in the semiconductor device.

Steps for forming or depositing polycrystalline diamond include:

1) growing an oxide, for example TEOS on a silicon substrate;

2) etching holes or trenches in the oxide (preferably with a via density of approximately 30–40%). Etching may be advanced into the silicon substrate as well depending on the application for the semiconductor device; and 3) depositing diamond, diamond like carbon or equivalent material in the holes or trenches.

Diamond may be deposited within the holes or trenches by combining a gas mixture of $CH_4$ and $H_2$ in a hot filament system under high pressure, for example, 30–40 Torr. Diamond may be deposited in either a selective or blanket fashion. RIE may be used to remove diamond in areas where it is not needed. The present invention may be used to produce a diamond deposition on either bulk silicon or silicon on insulator (SOI) substrates.

Figure 3:
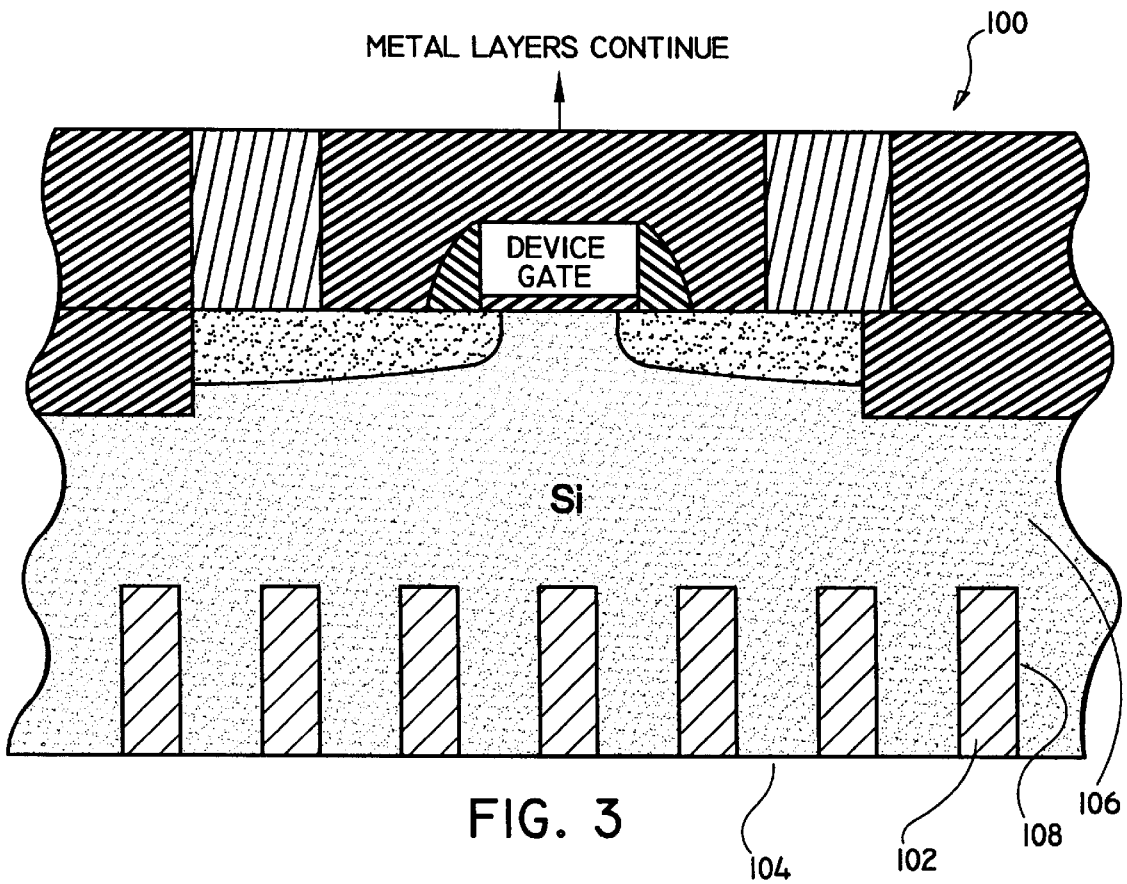
FIG. 3 is a cross-sectional view of a semiconductor chip structure in which diamond thermal conductors are embedded in a backside of a chip.

Referring to FIG. 3, an embodiment of an embedded thermal conductor structure 100 is shown. Thermal conductor structure 100 has embedded diamond fins 102 provided in a backside 104 of a substrate 106. Trenches 108 are formed on backside 104 with a chemical etch or by mechanically scribing the chip. Trenches 108 are preferably narrow at the bottom and wide at the top to fill trenches 108 without creating voids. Trenches 108 are filled with diamond using the previously described process. Diamond may be removed from backside 104 or left on the backside surface as a thermal conduction pathway depending on the application.

Figure 4:
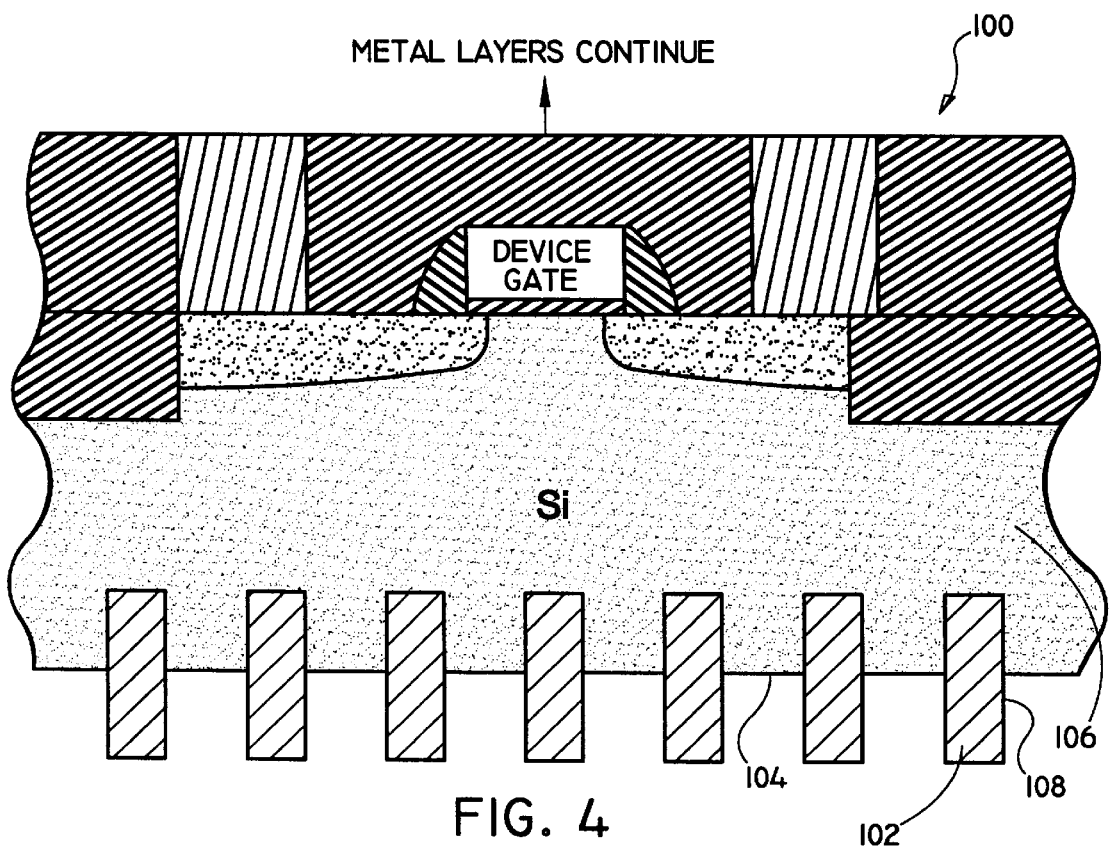
FIG. 4 is a cross-sectional view of a semiconductor chip structure shown in FIG. 3 in which diamond thermal conductors have an increased exposure area by etching back the backside of the chip.

After diamond fins 102 are grown, a mask, preferably silicon nitride or other oxygen resistive material, is deposited on backside 104 of substrate to prevent furnace oxidations from reacting with the diamond and carrying off the carbon in a gaseous form, carbon dioxide ($CO_2$). After thermal oxidations have been completed, a potassium hydroxide (KOH) solution may be used to etch back the silicon of substrate 106 to expose more diamond surface area, as shown in FIG. 4. The silicon may be removed by the potassium hydroxide etch, however, some portion of diamond fins 102 must remain buried in the silicon to keep the fin secured.

Figure 5:
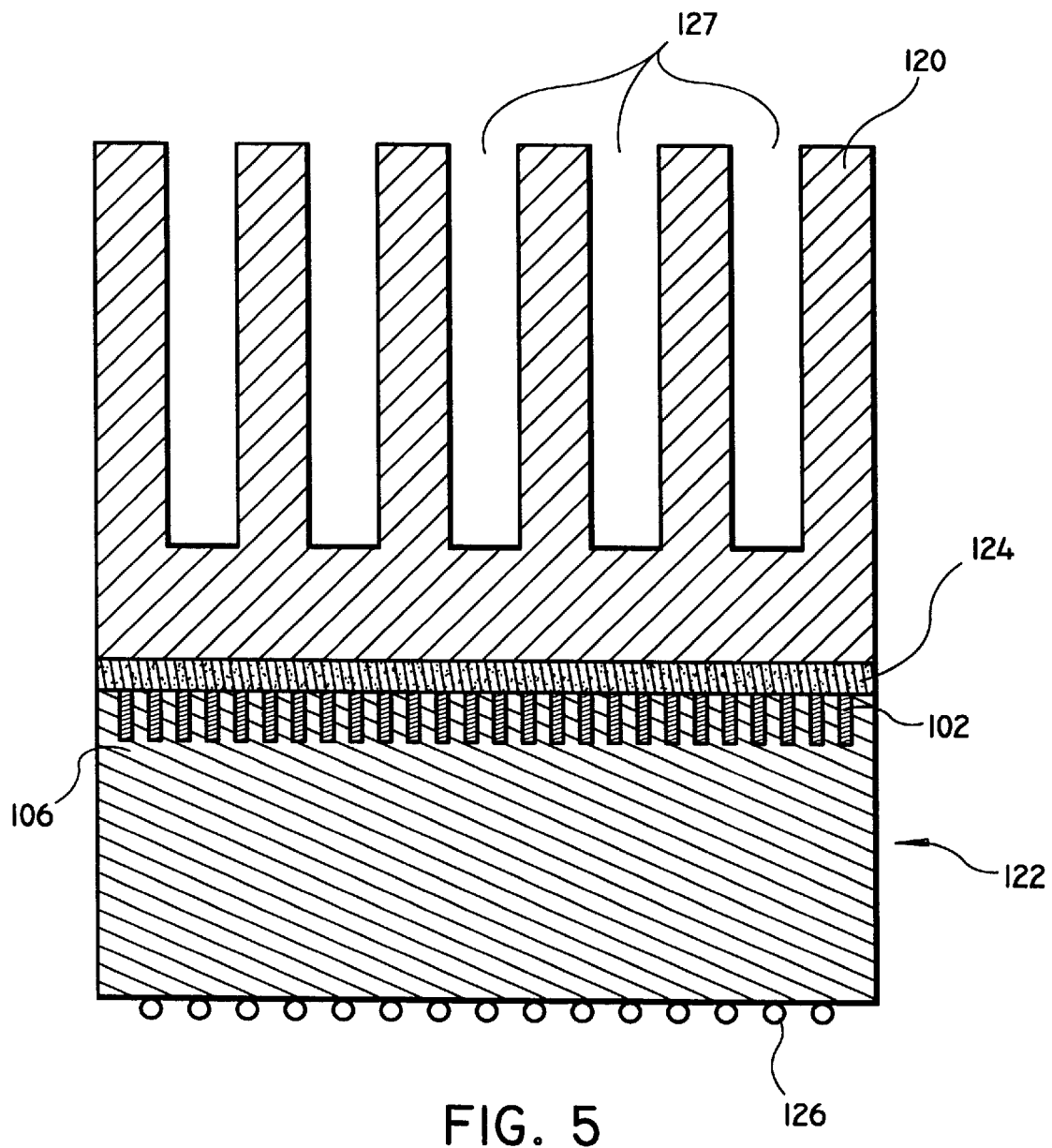
FIG. 5 is a cross-sectional view of a semiconductor chip structure having embedded thermal conductors, fixed with thermal grease, to a cooling tower.

Referring to FIG. 5, embedded thermal conductors 102 may be attached to a cooling tower 120. A semiconductor chip 122 is connected to tower 120 with a thin layer of thermal grease 124. Heat is removed by air which circulates through spaces 127 within tower 120. Diamond fins 102 remove heat from substrate 106. The heat is conducted through layer of thermal grease 124 and transferred to cooling tower 120 where the heat is dissipated to the air. C4 pads 126 are used to make electrical connections from chip 122 to a multi-chip module (not shown).

Integrated thermal conductors are particularly useful in Silicon On Insulator (SOI) technology. A buried layer of $SiO_2$ is a thermal insulator. Therefore, the buried layer traps heat produced by active transistors thereby raising local temperatures beyond a desirable level. While this self-heating of SOI devices has attracted a substantial amount of attention, the problem of removing the heat still remains to be solved.

Figure 6:
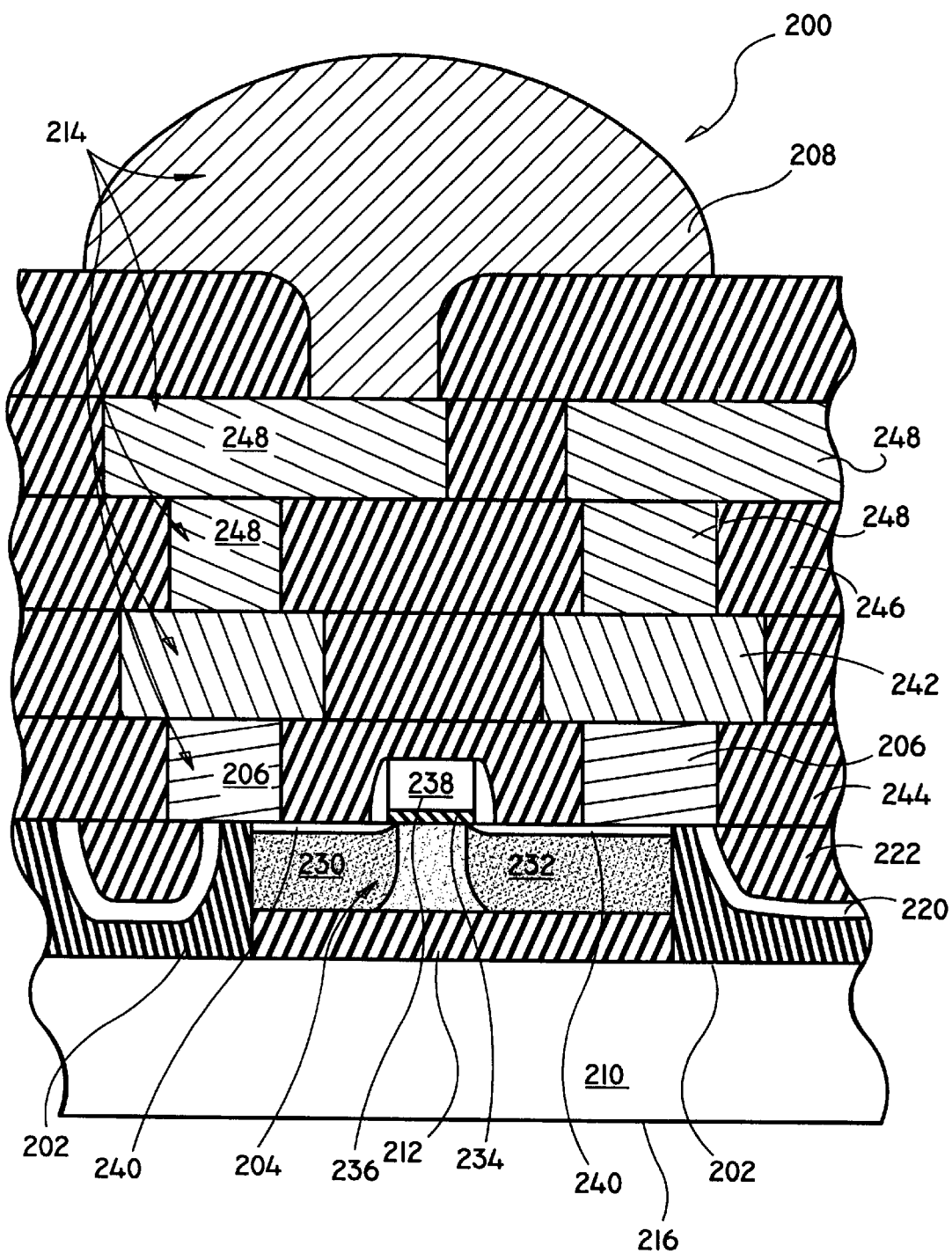
FIG. 6 is a cross-sectional view of one embodiment of a semiconductor structure with embedded thermal conductors without encroachment.

Referring to FIG. 6, a structure 200 is illustrated in which diamond thermal conductors 202 are integrated adjacent to a transistor 204 to remove excess heat therefrom. Although transistor 204 is shown, other semiconductor devices are contemplated, for example diodes, capacitors, resistors, etc. Metal layers 206 may be used in combination with the diamond thermal conductors 202 to conduct heat out through C4 pads 208 and into the module (not shown). Metal layers 206 include contacts and interconnects for electrically connecting transistor 204 which may contain Tungsten or it alloys. Metal layers may be fabricated to include high conductivity metals, for example, copper and it alloys or aluminum and its alloys. These metals would further increase heat flow away from transistor 204.

Thermal conductors 202 also conduct heat laterally along the active device region and vertically into a substrate 210 below a buried oxide layer (BOX) 212. Etching of BOX layer 212 may be performed by isotropic etching or anisotropic etching. As a result of anisotropic etching, for example by reactive ion etching (RIE), thermal conductors 220 (FIG. 6) do not encroach an area below transistor 204. It is important to note that the diamond is deposited directly onto substrate 210.

Figure 7:
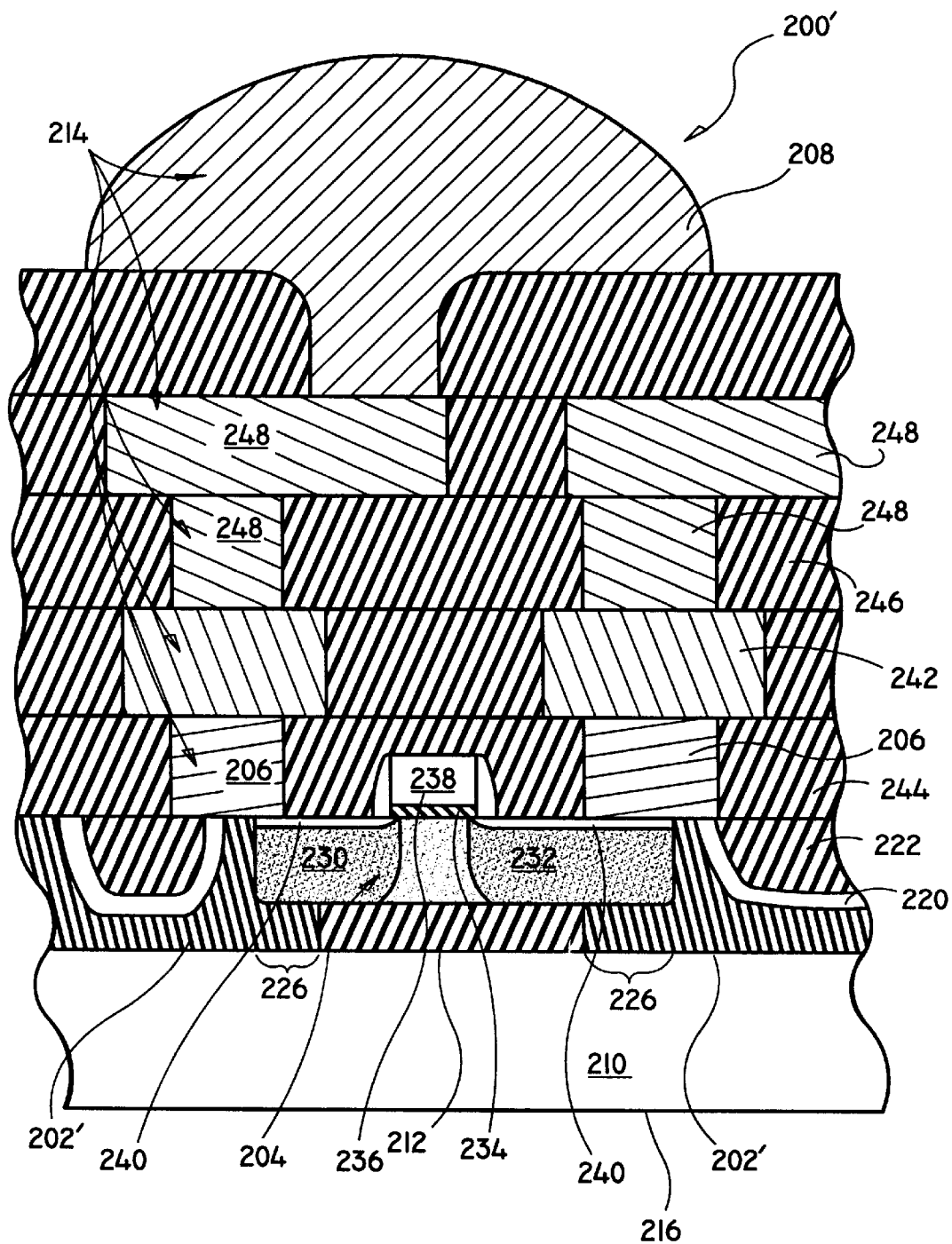
FIG. 7 is a cross-sectional view of another embodiment of a semiconductor structure with embedded thermal conductors having partial encroachment.

Referring to FIG. 7, another embodiment for a structure 200' is shown. By isotropically etching BOX layer 212 with hydrofluoric acid, for example, a channel may be formed into which diamond may be deposited thereby replacing a portion of BOX layer 212 and remaining in contact with substrate 210. Encroachments 226 of thermal conductors 202' are therefore located below transistor 204 to increase heat flow away from the transistor. Areas below transistor may be made available for encroachments 226 by isotropic etching. Isotropic etching may be performed by a CVD process as is known to those skilled in the art.

Figure 8:
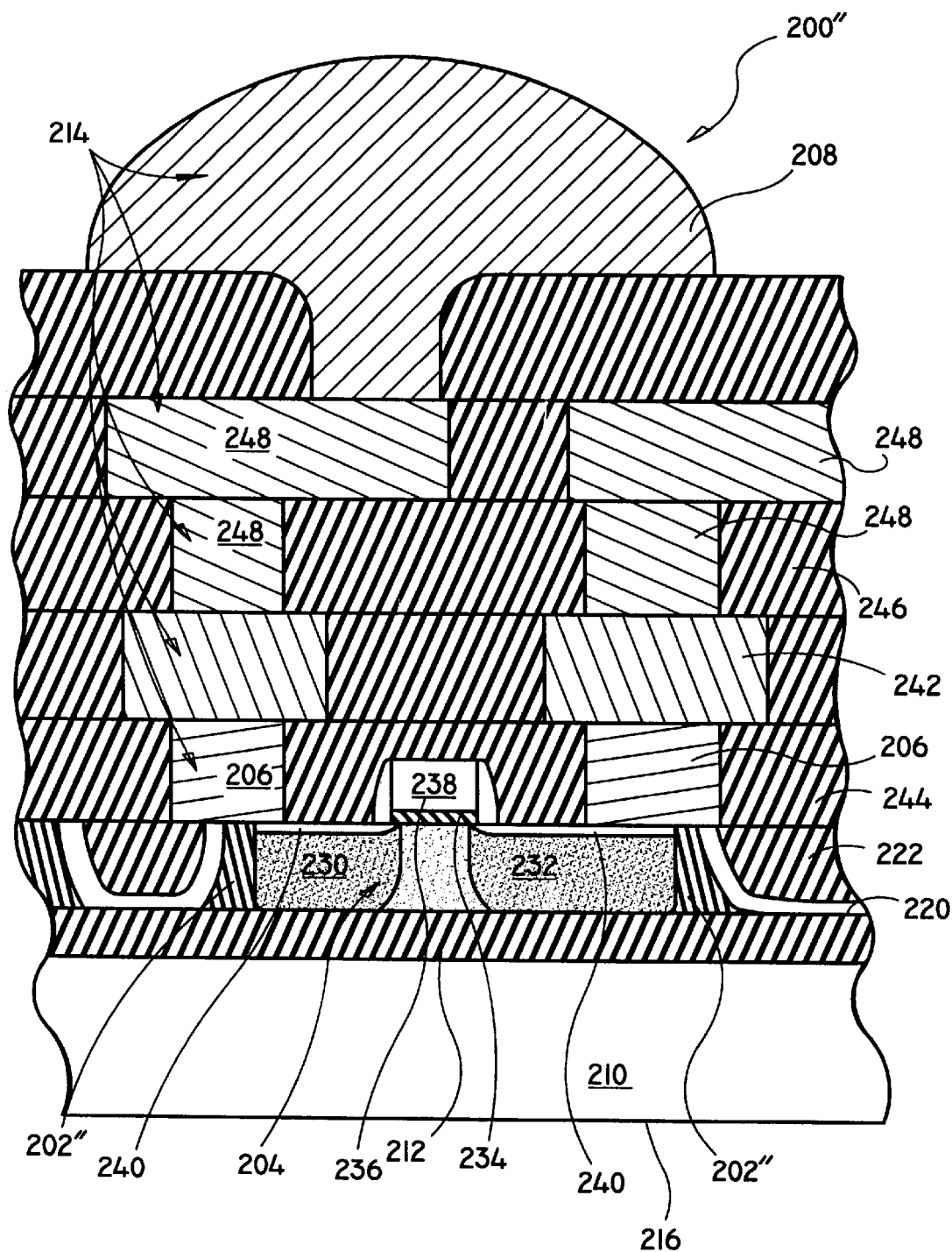
FIG. 8 is a cross-sectional view of another embodiment of a semiconductor structure with embedded thermal conductors in contact with an oxide layer.

Referring to FIG. 8, another embodiment for a structure 200'' includes thermal conductors 202'', in contact with BOX layer 212. In this embodiment, thermal energy is transferred through composite cooling structure 214 only.

Referring to FIGS. 6–8, thermal conductors 202, 202' and 202'' may be grown in selected regions with an additional mask step. In certain cases, it is advantageous to discriminately place thermal conductors 202, 202' and 202'' adjacent to devices requiring additional heat sinks. For example, in a mixed analog-digital chip, it may be desired to insulate digital circuitry from analog circuitry. In this case, thermal conductors 202, 202' and 202'' may be formed adjacent to analog transistors only. The heat from the analog circuitry would be transferred away from the transistors.

Referring again to FIG. 6, composite cooling structure 214 within structure 200 uses existing metal layers 206, attached in series with thermal conductors 202, to draw heat away from active regions of structure 200 through to the surface C4 pads 208. This structure also conducts heat into substrate 210 where it will seek lower temperature areas either on a backside 216 of structure 200 or pass through another diamond conductor and then out through a composite cooling structure 214. A layer 220 may be formed from nitride to protect the diamond in thermal conductors 202 from oxidation during construction of structure 200. A region 222 may be filled with a metal, for example Tungsten or Tungsten silicide to provide increased heat flow away from the devices. Alternately region 222 may be filled with silicon dioxide.

Growth of diamond thermal conductors 202 may be incorporated into an SOI process. SOI structure 200 has a buried oxide layer 212 created by implanting oxygen deep into a substrate 210, preferably made of silicon. By annealing at temperatures of approximately 800–1200° C., buried oxide layer 212 is formed. A mask is formed and reactive ion etching creates openings for shallow trenches to be formed down to buried oxide layer 212. Polycrystalline diamond is grown in the shallow trenches in contact with substrate 210 by the process described above. As a result the diamond is deposited in the recessed area which is close to source 230 and drain 232 where heat is generated. A mask 220, preferably silicon nitride ($Si_3N_4$), is deposited on top of diamond followed by oxide or metal deposition 222 to fill up the shallow trench. Mask 220 covers the diamond to prevent subsequent thermal oxidations from reacting with the diamond. The whole stack (oxide/nitride/diamond) is then polished. At the end, exposing the surface to Oxygen, post RIE, is carried out to remove diamond on the top of silicon surface.

The threshold voltages are adjusted by an implantation step. The devices are formed by first growing thin gate oxide 234, depositing polysilicon 236 and etching a gate 238 using device level masks (not shown). A source 230 and a drain 232 are implanted using dopants (Arsenic or Boron) with appropriate energies. Junctions 240 are formed by driving the dopants in at temperatures of about 600 to about 900° C. Then junctions 240 and gate 238 are silicided. Once the devices are formed contacts 206 and local interconnects 242 to the devices are opened up into an oxide layer 244 deposited on top of source 230 and drains 232. Interconnects 242 and contacts 206 are preferably filled with tungsten (in, for example, damscene or dual damascene mode) with a refractory liner, e.g Ti/TiN, Ti/W, as is known in the art.

Once again depositing an additional oxide layer 246 on top of local interconnects 242, lines and vias are opened into oxide layer 246 and filled with Tungsten in single or dual damascene mode, for example. Excess Tungsten is then removed from oxide layer 246 by RIE or chemical mechanical polishing. The process may be repeated to-create a multilevel structure.

Contacts 206 overlap thermal conductors 202 as shown in FIG. 6. Then depositing low resistivity metal, such as, Al or Al alloys, or Cu or Cu alloys with a diffusion barrier (e.g Ti/TiN, Ta, Ta compounds and/or alloys, etc.), interconnects 248 are formed. Metal is polished off to create lines and vias. The process may be repeated to create a multilevel structure. Thermal conductors 202 serve as the heat sink which can be formed very close to the devices, for example a transistor. Contacts 206 contact the active regions and overlap onto thermal heat conductors 202 to provide a heat conduction path through contacts 206, local interconnect 242 and interconnects 248. By using high conductivity metals heat removal is improved.

With extra mask steps, it is contemplated the thermal conductors may be formed adjacent to selected devices, for example transistors or resistors, on a semiconductor device. In this way, thermal conductors remove heat from selected devices. It is further contemplated that fins (FIG. 3), made preferably of diamond or equivalent materials, may be used in conjunction with embedded thermal conductors (FIG. 6–8) to further dissipate heat. It is still further contemplated that thermal conductors as described in accordance with the present invention may be formed alongside transistors or other devices in "bulk" silicon or silicon substrates for chips not having BOX layers thereon. In accordance with the present invention, it is also contemplated that thermal conductors using diamond like substances may be incorporated into dielectric regions above active silicon since these materials have lower thermal processing thresholds requisite for later stages of chip processing.

Having described preferred embodiments of an embedded thermal conductor for semiconductor chips and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims:

What is claimed is:

1. A method of forming embedded thermal conductors in a semiconductor chip comprising the steps of:

providing a substrate having an oxide layer formed thereon;

etching trenches into the oxide layer;

depositing diamond to fill the trenches to form thermal conductors contacting the substrate; and forming devices and contacts adjacent to the thermal conductors for providing heat flow paths to reduce an operating temperature of the devices.

2. The method of forming embedded thermal conductors as recited in claim 1 wherein the step of depositing diamond to fill the trenches to form thermal conductors further comprises the step of mixing methane gas and hydrogen gas in a hot filament system to produce polycrystalline diamond.

3. The method of forming embedded thermal conductors as recited in claim 1 wherein the step of forming devices and contacts adjacent to the thermal conductors for providing heat flow paths further comprises the steps of:

depositing a nitride layer on the thermal conductors to provide protection from diamond oxidation; and forming openings in the nitride layer to connect contacts to the thermal conductors.

4. The method of forming embedded thermal conductors as recited in claim 1 further comprises the step of forming interconnects for connecting to the contacts such that the interconnects provide a heat flow path from the thermal conductors.

5. The method of forming embedded thermal conductors as recited in claim 1 further comprising the step of extending the thermal conductors between the substrate and the devices.

6. The method of forming embedded thermal conductors as recited in claim 5 wherein the step of extending the thermal conductors between the substrate and the devices further comprises the steps of:

isotropically etching the oxide layer to remove the oxide layer below the devices; and filling below the devices with diamond.

7. A method of forming embedded thermal conductors in a semiconductor chip comprising the steps of:

providing a substrate having a backside portion;

etching trenches into the backside portion; and depositing diamond to fill the trenches to form thermal conductors contacting the substrate for providing heat flow paths to reduce an operating temperature of the devices.

8. The method of forming embedded thermal conductors as recited in claim 7 wherein the step of depositing diamond to fill the trenches to form thermal conductors further comprises the step of etching back the backside portion to expose an additional area of the thermal conductors.

9. The method of forming embedded thermal conductors as recited in claim 7, further comprising the step of applying a thermal grease to the backside portion.

10. The method of forming embedded thermal conductors as recited in claim 9, further comprising the step of contacting a heat sink to the thermal grease to provide heat dissipation for the semiconductor chip.

11. The method of forming embedded thermal conductors as recited in claim 7 further comprising the step of coating the thermal conductors with a oxygen resistive material to protect the thermal conductors during processing.

12. A method of forming embedded thermal conductors in a semiconductor chip comprising the steps of:

providing a substrate having an oxide layer formed thereon;

depositing diamond to form thermal conductors on the oxide layer; and forming devices adjacent to the thermal conductors for providing heat flow paths to reduce an operating temperature of the devices.

13. The method of forming embedded thermal conductors as recited in claim 12 wherein the step of depositing diamond to form thermal conductors further comprises the step of mixing methane gas and hydrogen gas in a hot filament system to produce polycrystalline diamond.

14. The method of forming embedded thermal conductors as recited in claim 12 wherein the step of forming devices adjacent to the thermal conductors for providing heat flow paths further comprises the steps of:

depositing a nitride layer on the thermal conductors to provide protection from diamond oxidation; and forming openings in the nitride layer to provide for connections to the thermal conductors.

15. The method of forming embedded thermal conductors as recited in claim 12 further comprising the step of forming contacts and interconnects for connecting to the thermal conductors such that the contacts and interconnects provide a heat flow path from the thermal conductors.

16. The method of forming embedded thermal conductors as recited in claim 12 further comprising the step of extending the thermal conductors between the substrate and the devices.

17. The method of forming embedded thermal conductors as recited in claim 12 wherein the step of extending the thermal conductors between the substrate and the devices further comprises the steps of:

isotropically etching the oxide layer to remove the oxide layer below the devices; and filling below the devices with diamond.

* * * * *